United States Patent
Mackintosh et al.

(10) Patent No.: US 9,970,125 B2
(45) Date of Patent: May 15, 2018

(54) METHOD FOR ACHIEVING SUSTAINED ANISOTROPIC CRYSTAL GROWTH ON THE SURFACE OF A SILICON MELT

(75) Inventors: Brian H. Mackintosh, Concord, MA (US); Peter L. Kellerman, Essex, MA (US); Dawei Sun, Nashua, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 13/398,884

(22) Filed: Feb. 17, 2012

(65) Prior Publication Data

US 2013/0213295 A1 Aug. 22, 2013

(51) Int. Cl.
| | | |
|---|---|---|
| C30B 15/20 | (2006.01) | |
| C30B 15/00 | (2006.01) | |
| C30B 15/14 | (2006.01) | |
| C30B 15/06 | (2006.01) | |
| C30B 29/06 | (2006.01) | |

(52) U.S. Cl.
CPC ............. *C30B 15/14* (2013.01); *C30B 15/06* (2013.01); *C30B 29/06* (2013.01); *Y10T 117/1008* (2015.01); *Y10T 117/1044* (2015.01); *Y10T 117/1048* (2015.01); *Y10T 117/1068* (2015.01)

(58) Field of Classification Search
CPC .......... C30B 15/06; C30B 15/14; C30B 29/06
USPC .................................................... 117/15, 47
See application file for complete search history.

(56) References Cited

U.S. PATENT DOCUMENTS

| | | | |
|---|---|---|---|
| 4,264,407 A | 4/1981 | Shudo et al. | |
| 4,289,571 A | 9/1981 | Jewett | |
| 4,417,944 A * | 11/1983 | Jewett | C30B 15/06 117/212 |
| 5,154,512 A | 10/1992 | Schietinger et al. | |
| 5,156,664 A * | 10/1992 | Maltby et al. | 65/182.2 |
| 5,505,813 A * | 4/1996 | Scheifele et al. | 156/380.1 |
| 5,769,540 A * | 6/1998 | Schietinger | G01B 11/06 374/127 |
| 6,443,221 B1* | 9/2002 | Suzuki et al. | 164/502 |
| 7,816,153 B2 | 10/2010 | Kellerman et al. | |

(Continued)

FOREIGN PATENT DOCUMENTS

| | | |
|---|---|---|
| EP | 2319089 A2 | 5/2011 |
| WO | 2009114764 A2 | 9/2009 |

OTHER PUBLICATIONS

Kudo, B., Improvements in the Horizontal Ribbon Growth Technique for Single Crystal Silicon, Journal of Crystal Growth 50, 1980, pp. 247-259, North-Holland Publishing Company.

(Continued)

*Primary Examiner* — Hua Qi

(57) ABSTRACT

An apparatus for growing a crystalline sheet from a melt includes a cold block assembly. The cold block assembly may include a cold block and a shield surrounding the cold block and being at an elevated temperature with respect to that of the cold block, the shield defining an opening disposed along a surface of the cold block proximate a melt surface that defines a cold area comprising a width along a first direction of the cold block, the cold area operable to provide localized cooling of a region of the melt surface proximate the cold block. The apparatus may further include a crystal puller arranged to draw a crystalline seed in a direction perpendicular to the first direction when the cold block assembly is disposed proximate the melt surface.

8 Claims, 8 Drawing Sheets

(56) References Cited

U.S. PATENT DOCUMENTS

| | | |
|---|---|---|
| 7,855,087 B2 | 12/2010 | Kellerman et al. |
| 2009/0233396 A1* | 9/2009 | Kellerman .............. C30B 15/06 438/57 |
| 2009/0302281 A1* | 12/2009 | Kellerman ............ C30B 11/001 252/519.1 |
| 2010/0038826 A1* | 2/2010 | Kellerman et al. ........... 264/430 |

OTHER PUBLICATIONS

International Search Report and Written Opinion dated Feb. 14, 2013, for PCT/US2012/069069, international filing date of Dec. 12, 2012.

\* cited by examiner

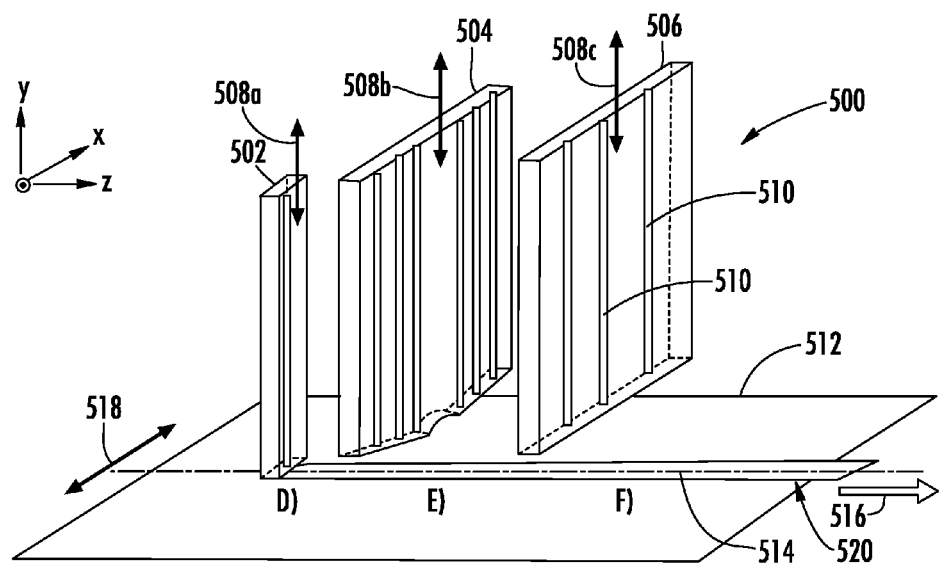
FIG. 5A
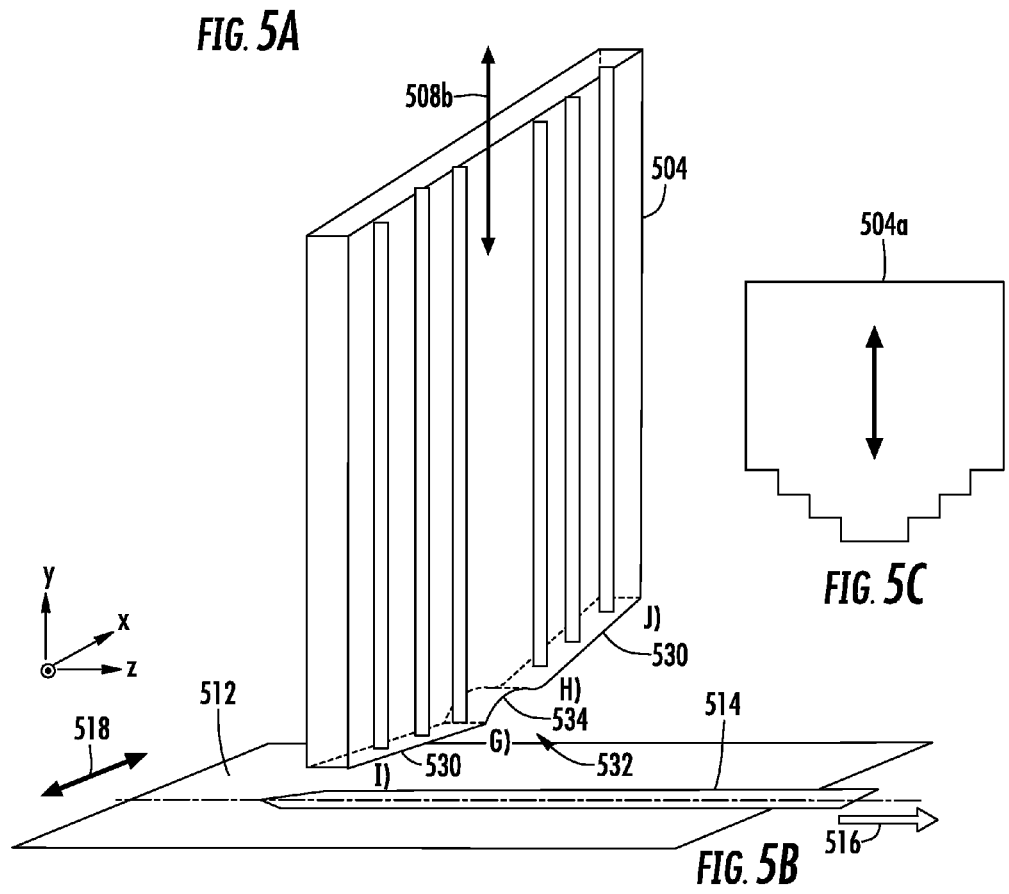
FIG. 5B
FIG. 5C

METHOD FOR ACHIEVING SUSTAINED ANISOTROPIC CRYSTAL GROWTH ON THE SURFACE OF A SILICON MELT

STATEMENT AS TO FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

BACKGROUND OF THE INVENTION

Field of the Invention

Embodiments of the invention relate to the field of substrate manufacturing. More particularly, the present invention relates to a method, system and structure for growing a crystal sheet from a melt.

Discussion of Related Art

Silicon wafers or sheets may be used in, for example, the integrated circuit or solar cell industry. Demand for solar cells continues to increase as the demand for renewable energy sources increases. One major cost in the solar cell industry is the wafer or sheet used to make these solar cells. Reductions in cost to the wafers or sheets will, consequently, reduce the cost of solar cells and potentially make this renewable energy technology more prevalent.

One method that has been investigated to lower the cost of materials for solar cells is the vertical pulling of thin silicon ribbons from a melt that cool and solidify into a crystalline sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient.

Producing sheets (or "ribbons") horizontally from a melt, such as so-called horizontal ribbon growth (HRG) has also been investigated. Earlier attempts employed helium convective gas cooling to achieve the continuous surface growth needed for ribbon pulling. These early attempts have not met the goal of producing a reliable and rapidly drawn wide ribbon with uniform thickness that is "production worthy."

Although radiative cooling of a silicon melt has been proposed as an alternative method of forming crystalline silicon, a problem arises because the large difference in emissivity $\epsilon_s - \epsilon_l$ between solid and liquid silicon makes it difficult to obtain rapid solidification of the melt surface using radiative cooling. In view of the above, it will be appreciated that there is a need for an improved apparatus and method to produce horizontally grown silicon sheets from a melt.

SUMMARY OF THE INVENTION

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An apparatus for growing a crystalline sheet from a melt includes a cold block assembly. The cold block assembly includes a first cold block and a first shield that is at an elevated temperature with respect to that of the cold block and that surrounds the first cold block. The first shield comprises an opening disposed along a lower portion of the cold block that defines a first cold area comprising a first width along a first direction of the cold block. The first cold area is operable to provide localized cooling of a region of a melt surface proximate the first cold block. The apparatus further includes a crystal puller arranged to draw a crystalline seed in a direction perpendicular to the first direction when the first cold block assembly is disposed proximate the melt surface.

In another embodiment, a method includes providing a first cold block assembly proximate a melt surface, the first cold block assembly comprising a first cold block surrounded by a first shield that has an elongated opening disposed along a lower portion of the first cold block. This elongated opening faces the melt surface. The method also includes heating the first shield to a temperature within ten degrees Celsius of a temperature of the melt surface $T_m$ and providing cooling to the first cold block so as to form a cold area having a temperature $T_c$ that is less than $T_m$, and having an area defined by the elongated opening. The method further includes determining that a crystalline layer attached to a crystalline seed has formed, and pulling the crystalline seed along a first path orthogonal to a long direction of the elongated opening so as to form a continuous ribbon having a first width.

BRIEF DESCRIPTION OF THE DRAWINGS

FIG. 5a depicts an apparatus that includes cold block assemblies for initializing, widening, and sustaining growth of a crystalline ribbon from a melt.

FIG. 5b depicts an enlarged view of the widener of FIG. 5a.

FIG. 5c depicts an alternative widener consistent with the present embodiments.

FIG. 6b depicts a portion of the widener of FIG. 6a.

DESCRIPTION OF EMBODIMENTS

Figure 1A:
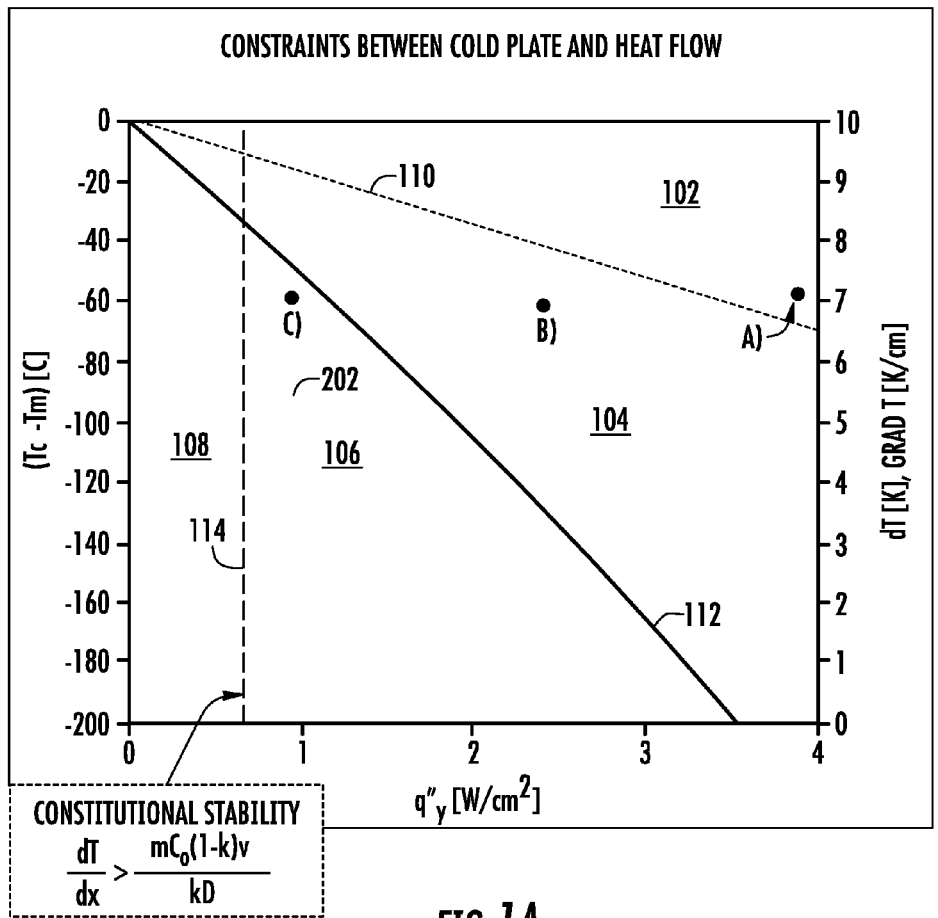
FIG. 1a is a graph that depicts growth regimes for growing silicon from a melt consistent with the present embodiments.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, the present embodiments provide novel and inventive apparatus and techniques for horizontal melt growth of a crystalline material, in particular, a monocrystalline material. In various embodiments apparatus for forming a sheet of monocrystalline silicon by horizontal melt growth are disclosed, though other materials, compounds, or alloys may be used. The apparatus disclosed herein may form long monocyrstalline sheets that may be extracted from a melt by pulling, flowing, or otherwise transporting the sheets in a generally horizontal direction. The melt may flow with the sheet in one embodiment, but also may be still with respect to the sheet. Such apparatus may be referred to as horizontal ribbon growth (HRG) apparatus because a thin monocrystalline sheet of silicon or silicon alloys is removed from the surface region of a melt and may attain a ribbon shape in which long direction of the ribbon is aligned along, for example, the pulling direction.

Recent efforts at developing HRG have explored the use of radiative cooling to form crystalline sheets of silicon. It has been noted that the emissivity in solid silicon $\epsilon_s$ is about three times the emissivity in liquid silicon $\epsilon_l$ at the melting temperature of 1412° C. In this manner, heat is preferentially removed from the solid phase over the liquid phase, which forms a necessary condition for stable crystallization. In a companion disclosure, "Method for Achieving Sustained Anisotropic Crystal Growth on the Surface of a Melt" (U.S. patent application Ser. No. 13/398,874, filed Feb. 17, 2012), incorporated by reference herein in its entirety, the present authors disclose a process window for successfully performing horizontal growth of crystalline silicon from a melt by providing a cold region that serves as a radiative heat sink over a localized area above the melt. This cold region has been treated as a solid plate that can absorb heat radiated from a melt surface. By balancing heat flow through the melt with heat radiated from the melt surface into a cold plate, a regime for forming constitutionally stable anisotropic crystalline growth from the melt surface has been identified.

Figure 1B:
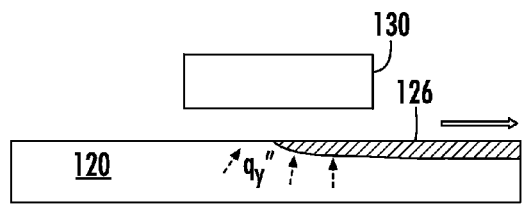
FIG. 1b, which illustrates pulling of a silicon ribbon.

FIG. 1a presents a two dimensional graphical summary of growth regimes for growing silicon from a melt consistent with the present embodiments. The parameters shown in FIG. 1a can be better understood by reference to FIG. 1b, which illustrates pulling of a silicon sheet, herein referred to as a silicon ribbon 126, along a surface of a melt 120. A cold plate 130 is provided proximate the melt 120 for crystallizing the silicon ribbon 126. The ordinate of the graph of FIG. 1a is the value $T_c-T_m$ where $T_m$ is the melt temperature at the surface of the melt and $T_c$ is the temperature of a cold plate held proximate the melt surface. In particular, a greater absolute value of $T_c-T_m$ leads to more radiative heat being absorbed from the melt 120. The abscissa is the heat flow through the melt $q_y"$ in a vertical direction towards the cold plate 130. As illustrated in FIG. 1a, different combinations of $T_c-T_m$ and $q_y"$ lead to different regimes, labeled 102, 104, 106, and 108, which are further explained with respect to FIGS. 1c-1e.

Figure 1C:
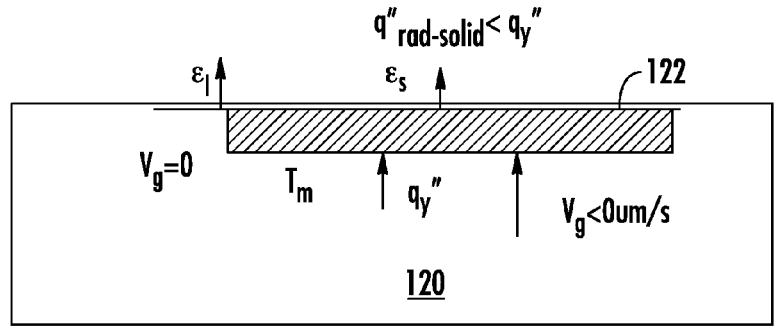
FIG. 1c shows a scenario in which a seed crystal is placed in melt under a first set of conditions.

FIG. 1c shows a scenario in which a seed crystal 122 is placed in melt 120 under the conditions specified by point A) in FIG. 1a, which lies within the regime 102. The regime 102 is a regime in which no crystal growth occurs, and is produced by a combination of relatively lower $T_c-T_m$ and relatively higher heat flow through the melt $q_y"$, which results in the heat radiated from the surface of the melt 120 being insufficient to promote crystallization due to the high heat flow through the melt $q_y"$. When the seed crystal 122 is placed in a melt 120 under conditions shown by point A), the heat flow through the melt $q_y"$ is nearly 4 W/cm² and is greater than the radiation heat flow from the solid $q"_{rad-solid}$, as shown. This leads to a condition of no growth and, instead, meltback of the seed crystal 122 into the melt 120. It is to be noted that the curve 110 in FIG. 1a, which bounds one edge of regime 102, corresponds to a zero growth condition, so that any point to the right and above curve 110 represents a meltback condition.

Figure 1D:
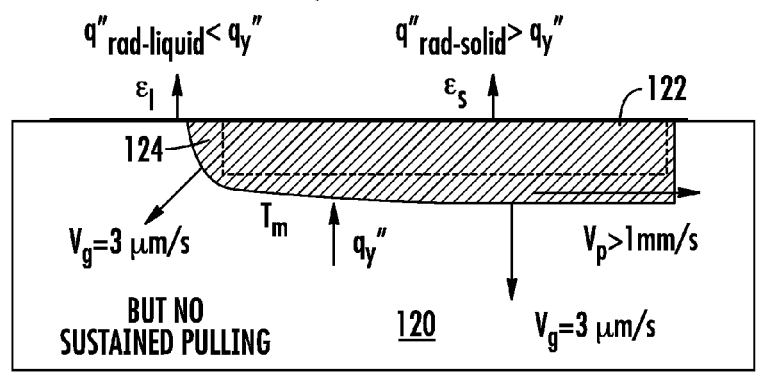
FIG. 1d illustrates a scenario when a seed crystal is placed in melt under a second set of conditions.

FIG. 1d illustrates a scenario specified by the point B) that lies in the growth regime 104, which is bounded by the curve 110 and curve 112. The growth regime 104 represents a regime in which constitutionally stable crystal growth occurs at relatively low growth rates. As shown in FIG. 1d, the $q"_{rad-solid}$ is greater than $q_y"$ and leads to isotropic growth of crystalline material 124 on the seed crystal 122. In the case illustrated, the growth rate $V_g$ is 3 μm/s. The radiation heat flow from the melt surface $q"_{rad-liquid}$ is less than the heat flow through the melt $q_y"$ so that the surface of the liquid adjacent the crystal seed remains in a liquid form.

Figure 1E:
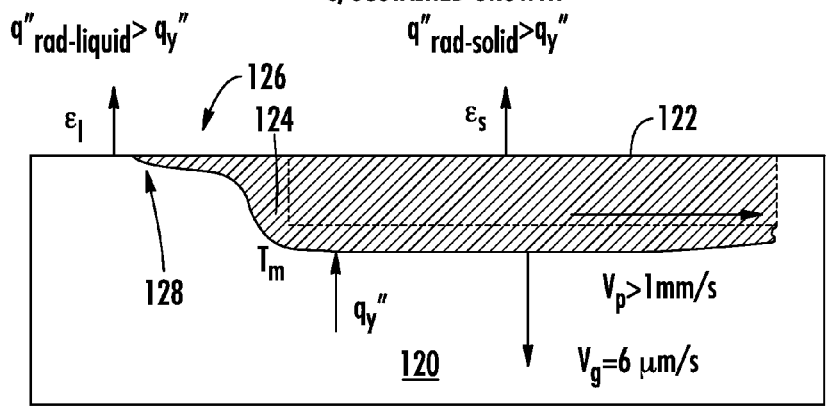
FIG. 1e illustrates a scenario when a seed crystal is processed consistent with the present embodiments.

FIG. 1e illustrates a scenario specified by the point C) that lies in the growth regime 106, which has been delineated for the first time by the present inventors. The growth regime 106 corresponds to a regime in which the combination of cold plate temperature $T_c$ and heat flow through the melt $T_c$ produce anisotropic crystal growth at surface of a melt by radiative cooling induced by the cold plate. When conditions fall within the growth regime 106, a crystalline sheet can be formed on the melt surface by pulling a crystalline seed underneath the cold plate. As shown in FIG. 1a, the growth regime 106 is bounded to the right and above by the curve 112. At the point C in growth regime 106, the cold plate temperature $T_c$ is also the same as that of points A) and B), while the heat flow through the silicon melt $q_y"$ is substantially less than that in points B) and C), that is, 1 W/cm². As illustrated in FIG. 1e, a seed crystal 122 is pulled to the right under conditions specified by point C). Under these conditions, the radiation heat from the seed crystal 122 that is, the radiation heat flow from the solid $q"_{rad-solid}$, as well as the radiation heat flow through the melt surface $q"_{rad-liquid}$ of the silicon melt 120, are each greater than the heat flow through the silicon melt $q_y"$. Accordingly, in addition to an isotropic growth rate $V_g$ of 6 μm/s, sustained anisotropic crystalline growth takes place at the surface of the silicon melt 120. In this manner, a silicon ribbon 126 forms at a leading edge 128, which edge remains at a fixed position while subjected to a pulling rate of 1 mm/s.

FIG. 1a depicts a further growth regime 108, which represents a regime of constitutional instability based on a growth rate of 6 μm/s. Thus, to the left of the line 114, which corresponds to the 0.6 W/cm², growth rates of 6 μm/s or greater may be constitutionally unstable given typical impurity concentrations that may be found in a melt of silicon. These impurities may include, for example, iron or other materials.

In view of the conditions specified in the graph of FIG. 1a, it will be appreciated that the condition for anisotropic crystal growth by radiative cooling may be difficult to obtain. For example, if the value of heat flow through the melt $q_y"$ is too low, constitutionally unstable growth takes place. Additionally, even moderate rates of heat flow through the melt $q_y''$, such as 2 W/cm², may be too high for anisotropic crystalline growth, instead yielding the slow isotropic crystal growth of growth regime 104 or meltback of a seed crystal of regime 102, depending upon the cold plate temperature $T_c$. Moreover, for cold plate temperatures $T_c$ that are only moderately lower than $T_m$ (see, e.g., $T_c-T_m=-30°$ C.), there is no range of heat flow that can yield anisotropic constitutionally stable crystalline growth from the melt. In other words, the width of the growth regime 106 vanishes at values of approximately $T_c-T_m<-30°$ C. Even at point C), when the cold plate temperature is 60° C. below $T_m$, the width of the growth regime 106, that is, the range of heat flow through the melt $q_y''$ capable of producing anisotropic crystal growth, extends only between about 0.6-1.2 W/cm². In order to maintain heat flow through the melt $q_y''$ within such a narrow range, this may require precise control of the temperature of a melt at both the bottom of the melt, as well as the top of the melt. On the other hand, as also illustrated in FIG. 1a, in order to expand the range of $q_y''$ for producing anisotropic crystal growth from the melt, the absolute value of $T_c-T_m$ can be increased. However, this requires introducing a cold plate in close enough proximity to the melt to effectively absorb the radiation, such as within a few millimeters or less, while still maintaining the cold plate temperature significantly lower than that of the melt, for example, on the order of hundreds of degrees. Also, the net thickness of the grown sheet depends on the width of the cold plate (along the pulling direction); accordingly, in order to maintain a thickness <200 μm, for example, it may be necessary to limit the width of the cold plate. The water cooled block enables removal of heat from a narrow region close to the surface.

The present embodiments address the above considerations by providing novel and inventive apparatus that can place a narrow cold zone or cold area proximate a melt surface that is effective in inducing anisotropic crystallization in a localized area of a melt surface while leaving adjacent areas of the melt undisturbed. This facilitates the ability to extract a thin sheet or ribbon of crystalline material at a rapid rate as described below.

Figure 2:
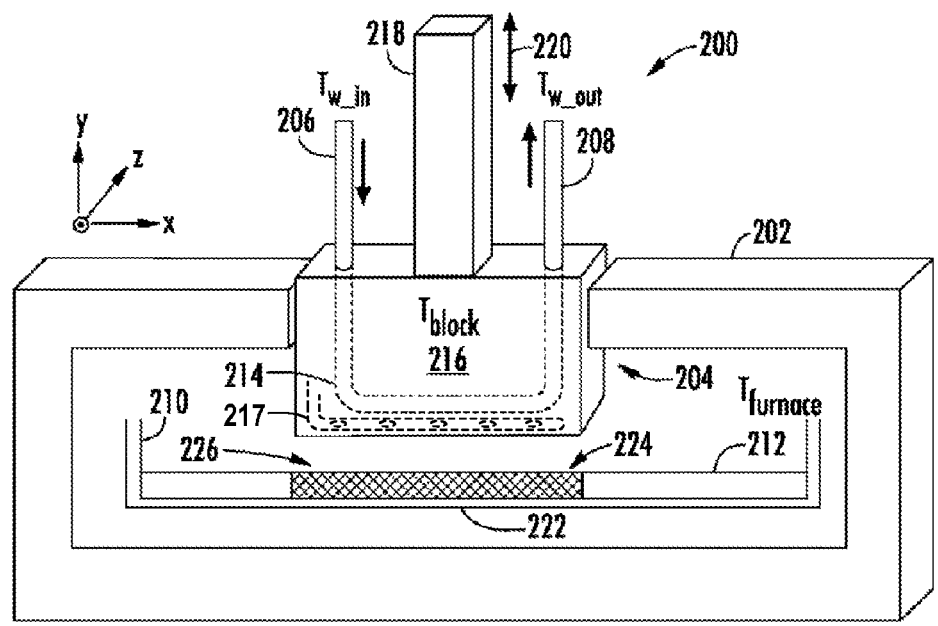
FIG. 2 depicts a front cross-sectional view of a system for anisotropic crystal growth from a melt consistent with the present embodiments.

FIG. 2 depicts a front cross-sectional view of a system 200 for anisotropic crystal growth from a melt consistent with the present embodiments. With reference to the coordinate system provided, in FIG. 2 the y-axis lies along a vertical direction and x-axis along a horizontal direction. The system 200 includes a furnace 202 that encloses a crucible 210. The furnace 202 is arranged to heat the crucible 210 and ambient within the furnace 202 to a temperature sufficient to melt a material from which a crystalline sheet is to be grown. For example, the furnace 202 can be heated to a temperature in the range of just above the melting temperature of silicon in order to grow sheets of silicon from the melt 212. The temperature of the furnace 202 $T_{furnace}$ is set at about 1412° C. to about 1430° C., for example. In this way, silicon can be maintained in molten form within the furnace 202 during anisotropic growth of a silicon sheet. In order to form a crystalline sheet of material from the melt 212 a crystalline seed (not shown) can be placed in the melt and drawn through the melt 212 under the proper conditions, as detailed below. The system 200 also includes a cold block assembly 204 that can be cooled to a temperature below the melting temperature of the melt 212. In the embodiment shown, the cold block assembly 204 has an input 206 and output 208 which may couple to an interior passage 214 to provide a cooling fluid, such as water, that can be transported through a cold block 216 located in the cold block assembly 204. The cooling fluid source (not illustrated) may be external to the cold block 216 or cold block assembly 204. The system 200 also includes a holder 218 coupled to the cold block 216 and operable to move along an axis 220, which can be perpendicular to the melt surface 224. The holder 218, which is some embodiments may form part of the cold block assembly 204, can thereby place the cold block 216 at varying distances above the melt surface 224.

In various embodiments, the cold block 216 may provide radiation cooling to portions 222 of the melt 212 proximate to the cold block 216 when the cold block 216 is positioned an appropriate distance from the melt surface 224. In order to provide a cold block 216 temperature $T_c$ that is sufficiently low to promote anisotropic crystal growth from melt 212 a high conductivity material can be used to construct the cold block 216. In one embodiment, the diameter of input and outputs 206, 208, as well as that of interior passage 214, can be 2.5 mm, and the cold block 216 can be 2 cm in length along the z-direction (into the page). With this configuration, a flow rate of 3 liters per minute of water is sufficient to remove 200 W of heat from the furnace 202 set at a temperature of about 1400° C., while the water temperature is maintained below 100° C. and the temperature rise of water from input 206 to output 208 is maintained below 1° C. Under such conditions, the cold block 216 can be brought within a required distance to crystallize a surface layer of the melt 212, such as about 1 mm from the melt surface 224, while the cold block temperature is accurately maintained at a desired $T_c$ that is below the $T_m$ of the melt.

In some embodiments, in addition to radiative cooling, a gas such as helium may be provided in the furnace 202 so that heat is transferred from the melt surface 224 via thermal conduction in addition to the radiative cooling provided by the cold block 216. In particular, a gas manifold 217 may be provided in the cold block 216 to flood the region 226 between cold block 216 and melt surface 224.

In various embodiments, a cold block, such as cold block 216, is surrounded by shielding (not shown) (also termed "shield" herein), which can facilitate confinement of the radiative cooling effect of the cold block 216 to a small region of the melt surface. Referring also to FIGS. 1a and 1e, as discussed previously, a small heat flow through the melt $q_y''$ is required in order to provide constitutionally stable crystal growth, indicated by the regimes 104, 106 to the right of the curve 114. In order that this heat flow be kept from exceeding values to the right of the curve 110, sufficient cooling power should be provided in a confined manner to provide a low value of $T_c$, but only to a portion of a cold block proximate the leading edge 128 of the silicon ribbon 126 illustrated in FIG. 1e, so that other portions of the melt surface 224 as illustrated in FIG. 2 do not freeze.

Consistent with the present embodiments, the shielding of a cold block may be composed of heated elements, or "compensation heaters" that actively provide heat shielding surrounding the cold block independent of a furnace within which the cold block is located. For example, the shielding of a cold portion of a cold block may be provided such that only a surface or portion of a surface of the cold block that is physically proximate a melt is maintained at $T_c$, while other surfaces of the cold block are maintained at a higher temperature.

Figure 3:
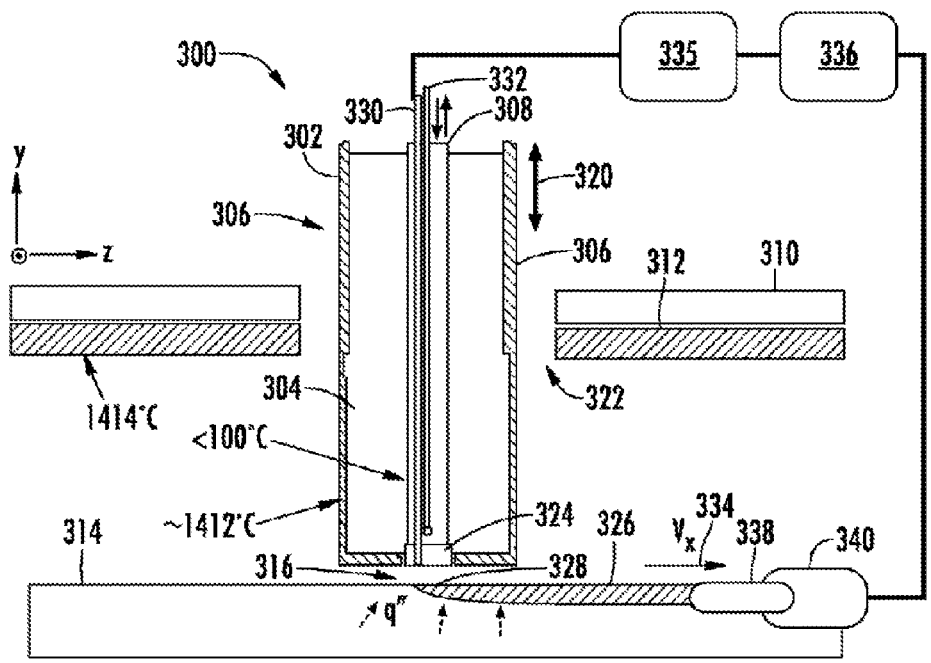
FIG. 3 depicts a side cross-sectional view of an exemplary system that includes a cold block assembly that is used to facilitate formation of a silicon ribbon.

FIG. 3 depicts a side cross-section view of an exemplary system 300 that includes a cold block assembly 302 that is used to facilitate formation of a silicon ribbon. With reference to the coordinate system provided, in FIG. 3 the y-axis lies along a vertical direction and z-axis along a horizontal direction, which may coincide with a pulling direction of a silicon ribbon. The cold block assembly 302 includes an insulator 304 that is adjacent to a cold block 308, which forms a central portion of the cold block assembly 302. Although not explicitly shown in FIG. 3, the cold block assembly 302 is water cooled in some embodiments, as also suggested in the embodiment of FIG. 2.

Shielding 306 surrounds the insulator 304 and the cold block 308 in the embodiment of FIG. 3. The shielding 306 may comprise compensation heaters that supply sufficient heat to maintain a temperature that is close to a furnace temperature provided by the furnace heater 310. In one example, the furnace heater 310 supplies heat to maintain the inside of the furnace liner 312 at a temperature slightly in excess of the melting temperature of the melt 314, such as a silicon melt, which may be 1414° C. for a reported melting temperature of 1412° C. In addition, in various embodiments, the shielding 306 is maintained at a temperature close to the temperature of the melt surface of melt 314. The term "close to the temperature of the melt surface" as used herein refers to a temperature within ten degrees Celsius of the melt surface temperature. In some embodiments for drawing silicon ribbons, the shielding 306 is heated to about 1402-1422° C. and in particular, to 1412° C. in one embodiment. In this manner, there is insignificant heat flow from other parts of the furnace and melt surface, and the majority of heat flow takes place from the surface of the melt 314 in a region 316 under the cold block assembly 302. Consistent with the present embodiments, the power density PD required to heat the shielding 306 to the desired temperature is given by $$PD = \frac{k(T_{furnace} - T_{block})}{d}$$

where $T_{block}$ is the temperature of the cold block 308 and the furnace temperature is $T_{furnace}$, the thickness and thermal conductivity of the insulator 304 are d and are k, respectively.

As further depicted in FIG. 3 the cold block assembly 302 may move along an axis 320 through opening 322 in the furnace liner 312, so that a lower portion 324 of the cold block 308 is brought proximate the melt 314. The lower portion 324 may have a higher temperature than upper portions of the cold block 308, but is up to hundreds of degrees cooler than the melt 314 temperature in some embodiments. When the lower portion 324 is brought sufficiently close to the melt 314, a solid sheet 326 crystallizes at the surface of the melt 314, as shown. However, because the shielding 306 extends around the cold block 308 and insulator 304, only a small area defined by the lower portion 324 has a temperature that is significantly lower than the melt 314 temperature, for example, more than twenty degrees lower than the melt 314 temperature. Thus, radiative cooling of the surface of the melt 314 only takes place near the leading edge 328 of the solid sheet 326, so that crystallization can continue to take place under the lower portion 324 as the solid sheet is pulled along direction 334, while other portions of the silicon melt 314 are undisturbed.

Figure 4A:
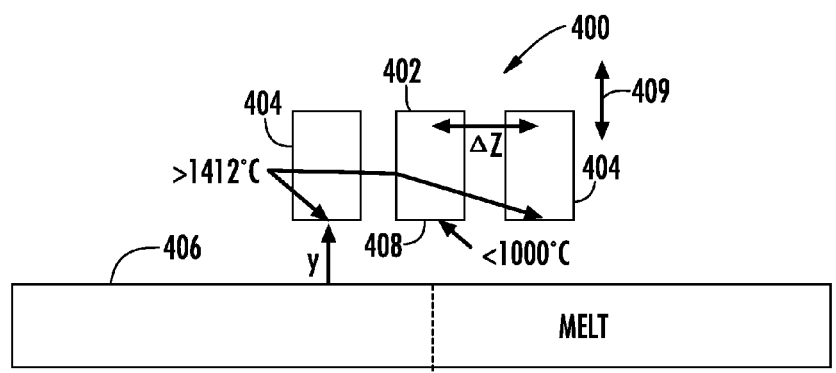
FIG. 4a depicts geometrical features of a cold block assembly consistent with the present embodiments.

In order to accurately control the radiative heat removal (cooling) provided by the cold block assembly 302, the lower portion 324 is precisely placed above a melt surface. FIG. 4a depicts geometrical features of a cold block assembly 400 consistent with the present embodiments. The cold block assembly 400 includes a cold block 402 that is surrounded by compensation heaters 404 disposed on opposite sides of the cold block 402. Consistent with the present embodiments, the magnitude and distribution of radiative cooling of a melt 406 may be controlled by moving the cold block assembly 400 along the axis 409 to vary the vertical distance y from the cold block 402 to melt 406, as well as by varying the temperature of the compensation heaters 404. In one embodiment, the temperature of the compensation heaters 404 proximate the melt 406 may be set at 1412° C., equivalent to the melting point of silicon. The temperature of the lower surface 408 of the cold block 402 may be set at less than 1000° C.

Figure 4B:
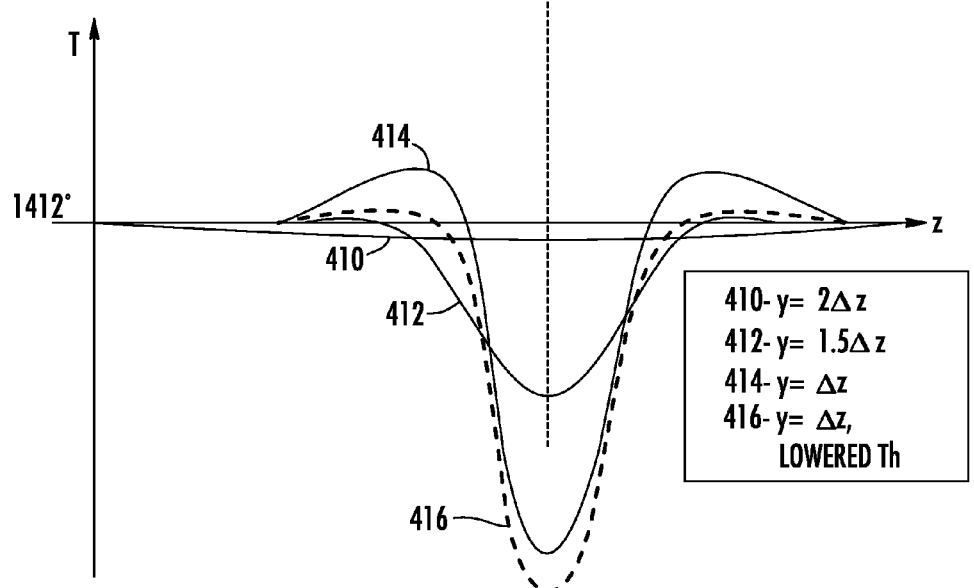
FIG. 4b presents modeling results that illustrate the variation of silicon melt temperature proximate a cold block.

FIG. 4b presents modeling results that illustrate the qualitative variation of silicon melt temperature proximate the cold block 402. The temperature variation is illustrated for a center-to-center separation of the cold block 402 and compensation heater 404 of Δz. The modeling results illustrate four curves that plot the temperature variation of the silicon melt as a function of the vertical separation y between the silicon melt 406 and lower surface 408 of the cold block 402. The values of y are expressed in terms of Δz. Curve 410 illustrates that for a y value of 2Δz, the temperature of the silicon melt is only slightly lowered. Curve 412 illustrates that for a y value of 1.5Δz, on the other hand, a significant lowering of the melt temperature occurs under the cold block 402. For a y value of 1Δz the curve 414 shows that the lowering of the melt temperature is even more pronounced and peaked more sharply directly under the cold block 402. The curve 416 illustrates that lowering the temperature $T_h$ of compensation heaters 404 of the cold block 402 (creating a larger value of $T_c-T_m$) while maintaining a y value of 1Δz creates a still larger lowering of the melt temperature. It can be shown that the dependence of the average cooling in the melt surface varies as a dipole field, i.e., Qrad(y) is approximately $(\Delta z/y)^3$. Thus, the cold block assembly 400 can be effectively "turned off" by raising the assembly a distance y that is equivalent to several times Δz, as suggested by the curve 410.

Referring again to FIG. 3, the cold block assembly 302 may include a light pipe 330, and may include a thermocouple 332 to measure temperature in the lower portion 324 of the cold block 308. When initializing the growth of a solid sheet 326 on the surface of the melt 314, it is advantageous to be able to discern the location of the leading edge 328 of the sheet from which a ribbon can subsequently be drawn. For example, with respect to the process of seeding and initially crystallizing the solid sheet 326, the position of the cold block assembly 302 is lowered while the end of a seed 338 is moved back and forth under the cold block assembly 302. When the proper condition is reached that allows independent freezing (crystallization) of the melt 314 next to the seed 338, the leading edge 328 of the solid sheet 326 remains under the cold block assembly 302 as the seed 338 is drawn by crystal puller 340 resulting in a continuously growing ribbon.

In order to directly view the crystallization, a window (not shown) could be installed in the furnace liner 312 to provide a view under the cold block 308. However, the window may not provide optimum monitoring of crystallization because of the lack of room under a wide cold block 308 to provide a view angle when the cold block assembly 302 is proximate the melt 314. The light pipe 330, which may comprise a sapphire material, may provide a more direct means to observe the melt 314, since an end of the light pipe 330 is located close to the leading edge 328 as shown in FIG. 3. Moreover, by housing the light pipe 330 within the cold block 308, deleterious high temperature interactions with material in the furnace ambient, such as silicon oxide, can be avoided. The light pipe 330 extends through the cold block 308 and may provide an image or signal well removed from the region near the melt 314 to another instrument, such as a pyrometer 335. The large difference between solid and liquid emissivity in materials such as silicon renders a leading edge 328 of a forming solid sheet 326 easily discernable with respect to the melt 314. In various embodiments, the signal from the instrument connected to the light pipe 330, such as pyrometer 335, can be fed back into a controller 336 of system 300, thereby enabling a fully automated ribbon initialization process. For example, when the solid sheet 326 begins to form on the melt 314, the surface region that provides light emission into the light pipe 330 may change from 100% liquid, having an emissivity of 0.2, to 50% liquid and 50% solid, where the emissivity is 0.6. Accordingly, the effective emissivity of the detected surface region may change to a value of about 0.4, which substantially changes the total light intensity detected by pyrometer 335, which is located at a remote end of the light pipe 330. This detected intensity may be forwarded to the controller 336 so that the controller may determine when to initiate a ribbon pulling process. For example, when the detected intensity reaches a predetermined threshold that is set to indicate the onset of crystallization, the controller 336 of system 300 may initiate a pulling of the seed 338 by crystal puller 340 in the direction 334 at a velocity $V_x$ as shown.

In various embodiments, multiple cold block assemblies are employed to grow a sheet of crystalline material from a melt in stages of a continuous process. In a first stage, an "initializer" cold block assembly is used to initiate growth of a narrow sheet, also termed a "narrow ribbon," of crystalline material from a melt with the aid of a seed crystal. The narrow ribbon is then subjected to a "widener" cold block assembly that increases the width of the narrow ribbon, and is subsequently subjected to a "sustainer" cold block assembly that produces a wider ribbon of constant width. In some embodiments, a sustainer and widener apparatus may be the same apparatus.

FIG. 5a depicts a horizontal ribbon growth (HRG) apparatus 500 that includes cold block assemblies for initializing, widening, and sustaining growth of a crystalline ribbon from a melt. In the embodiment illustrated, the cold block assemblies are narrow in the pulling direction 516, and thereby create a narrow cold area in the pulling direction 516 that may be longer in a direction orthogonal to the pulling direction 516. Although not separately shown, in various embodiments, one or more of the initializing, widening, and sustaining components of apparatus 500 may be provided with shields that define a cold area only in lower portions of the components that may be placed proximate a melt surface. In particular, an initializer 502 may include a cold block and a shield surrounding the cold block that is cooled to a first temperature $T_c$ below temperature of the melt 512, in order to induce anistropic growth of a sheet on the surface of the melt 512, as described above. A shield of the initializer 502 may be set at an elevated temperature with respect to that of the cold block, such that the shield defines an opening along a surface of the cold block proximate the surface of the melt 512. The opening in the shield thereby presents a cold area to a surface of the melt 512 when the initializer 502 is proximate the melt surface. This cold area is used to induce anisotropic crystal growth on the surface of melt 512 in a melt region defined by the size of the cold area, as detailed below.

Similarly, a widener 504 of the HRG apparatus 500 whose operation is detailed below may include a cold block and shield surrounding the cold block that is cooled to a second temperature $T_{c2}$ (which may or may not be the same as $T_c$) below temperature of the melt 512 in order to induce anistropic growth of a sheet on the surface of the melt 512. A shield of the widener 504 may be set at a second elevated temperature (which may or may not be the same as the elevated temperature of a shield of the initializer 502) with respect to that of the cold block of the widener 504, such that the shield defines an opening along a surface of the cold block proximate the surface of the melt 512. The opening in the shield of widener 504 thereby presents another cold area that defines the size of a region of the melt 512 where anisotropic crystal growth takes place on the surface of melt 512. As described below, the cold area of the widener 504 may be varied to change the width of a crystalline sheet while the sheet is being pulled.

Similarly, a sustainer 506 of HRG apparatus 500 may contain a cold block and a shield surrounding the cold block that is cooled to a third temperature $T_{c3}$ (which may or may not be the same as $T_{c2}$ and/or $T_c$) below temperature of the melt 512 in order to continue anisotropic growth of a sheet on the surface of the melt 512, as detailed below. A shield of the sustainer 506 may be set at a third elevated temperature with respect to that of the cold block (which may or may not be the same as the elevated temperature of a shield of the initializer 502 or widener 504), such that the shield defines an opening along a surface of the cold block proximate the surface of the melt 512. The opening in the shield thereby defines another cold area that may be used to continue anisotropic growth on the surface of melt 512 of a sheet whose width is determined by the size of the cold area.

As depicted in FIG. 5a, the initializer 502 is operable to move along the axis 508a that is perpendicular to the surface of a melt 512 so that the initializer 502 can be brought into close proximity with the melt 512 at point D) at which point formation of the narrow ribbon 514 is initiated. The widener 504 is positioned over a point E) that is downstream of the initializer 502 so that a narrow ribbon 514 initially formed at point D) and pulled in the direction 516 along the surface of melt 512 may subsequently traverse under the point E). The widener 504 is operable to move along axis 508b so that it also can be brought into close proximity with the surface of melt 512. In the image of FIG. 5a the widener 504 is retracted from the surface of the melt 512 and thereby exerts no cooling effect on the melt 512. Accordingly, the narrow ribbon 514 remains narrow at the instance depicted in FIG. 5a. When brought into close proximity with the melt 512, however, the widener 504 can widen the narrow ribbon 514 as described below. The sustainer 506 is positioned over a point F) (also in a retracted state in FIG. 5a) that is downstream of the initializer 502 and widener 504 so that a ribbon initially formed at point D) and pulled in the direction 516 along the surface of melt 512 may subsequently traverse under the point F). The sustainer 506 is operable to move along axis 508c so that it also can be brought into close proximity with the surface of melt 512. When brought into close proximity with the melt 512, the sustainer 506 can maintain a width of a ribbon at the width defined by the widener 504, as detailed below. As also shown in FIG. 5a, each of the cold knives may have a light pipe or light pipes 510 to monitor crystallization as described above.

In various embodiments, the HRG apparatus 500 may be operated according to a desired program or procedure to produce a target ribbon size and properties. In particular, to achieve minimal dislocations in a growing ribbon the initializer 502 can have a narrow dimension in the direction 518, which is normal to the pulling direction 516. The narrow ribbon 514 ideally attains the same crystallographic orientation as the seed crystal (not shown). By providing an initializer 502 that is narrow in the direction 518, single crystalline growth is promoted for narrow ribbon 514, and any dislocations are more likely to "heal" by migrating and terminating at the edge 520 of narrow ribbon 514.

In order to widen an initially narrow ribbon 514 to a desired width, the widener 504 can promote monotonic outward growth of the narrow ribbon 514 in the direction 518. This requires that the widener 504 increase the cold area width in the direction 518 as a function of time while the narrow ribbon 514 is pulled along direction 516. Consistent with the present embodiments, FIGS. 5a, 5b and FIGS. 6a, 6b depict two separate configurations of a widener that can accomplish this widening. In the example of FIG. 5a, the widener 504 comprises a curved or tapered surface on its lower end. The term "curved" as used in conjunction with the lower end of the widener 504, refers to a surface that is not parallel to the melt 512 surface, and may be a linear surface or may form an arc, for example. Other designs, such as using multiple surfaces at different distances from the melt (i.e., a block triangular pattern) also may be used, as illustrated for widener 504a in FIG. 5c. FIG. 5b depicts an enlarged view of the widener 504 in which tapered or curved surfaces 530 are shaped such that the portion of the curved surfaces 530 at inner points G) and H) are closer to the melt 512 that are outer points I) and J). Since the effective radiative cooling power provided by the widener 504 has a sensitive dependence on the gap between the widener 504 and a melt 512 surface, the cooling effect can be graded along the direction 518 by the curved surfaces 530, which may have a linear of arcuate shape in alternative embodiments, as noted.

Accordingly, when the widener 504 is lowered towards a melt surface, the width of a cold region that can crystallize the melt expands outwardly with time during the lowering process. Thus, although the entire width (along the x-direction) of the widener 504 may be cooled, the effective cold area presented to the melt 512 may change with time as different portions of the lower surface of the widener 504 become close enough to the melt to exert a cooling influence at different points in time. In this manner, a ribbon drawn under the widener 504 can expand in width as the widener 504 is lowered. In the embodiment shown in FIGS. 5a, 5b, the widener 504 includes a recess 534 in the innermost region. The recess 534 can have a width comparable to a width of a preexisting ribbon, such as the narrow ribbon 514 formed by the initializer 502. The recess 534 elevates the innermost region 532 of the widener 504 away from the surface of a melt 512 so that a preexisting narrow ribbon 514 that is drawn under the widener 504 is further away from a cold region and therefore tends to experience less crystallization that would tend to thicken the existing narrow ribbon 514 in the direction parallel to the axis 508b. This may prevent the narrow ribbon 514 from becoming excessively thick at least under the innermost region 532, which may provide little, if any, cooling effect to the narrow ribbon 514 passing thereunder. However, it is to be noted that the configuration of the widener 504 tends to crystallize those regions of the melt 512 that lie beneath the parts of the widener 504 denoted by points G) and H) before the regions denoted by points I) and J), thereby providing a taper in thickness of a widened ribbon at least under those portions of the widened ribbon.

Figure 6A:
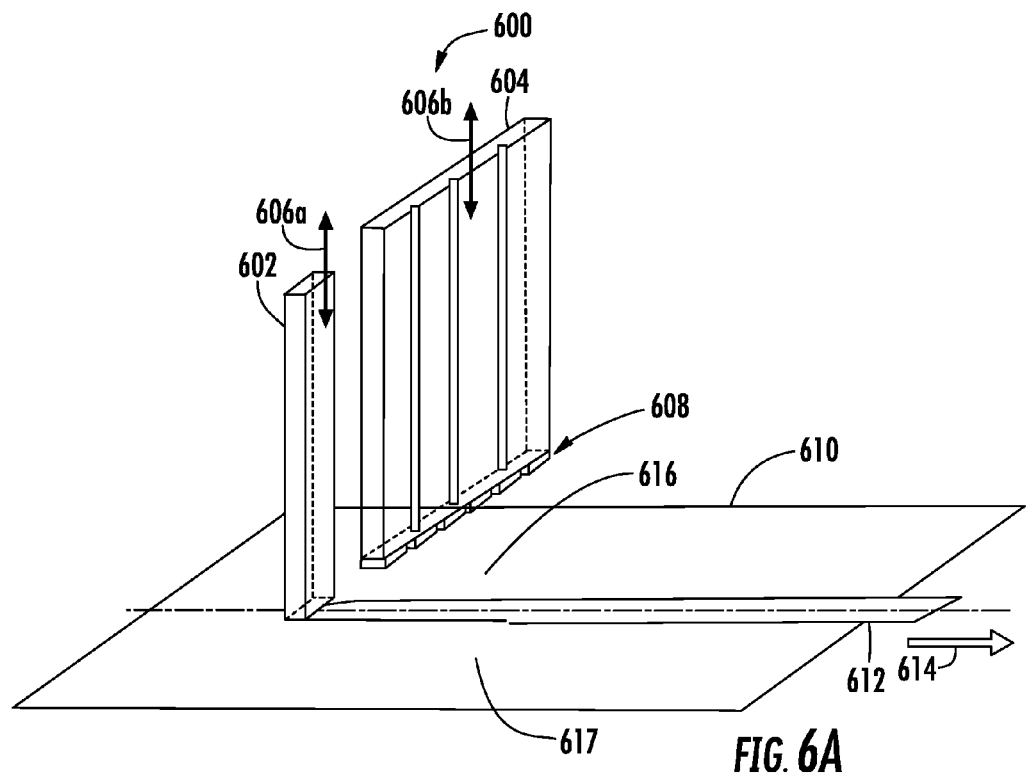
FIG. 6a depicts another embodiment of a widener.
Figure 6B:
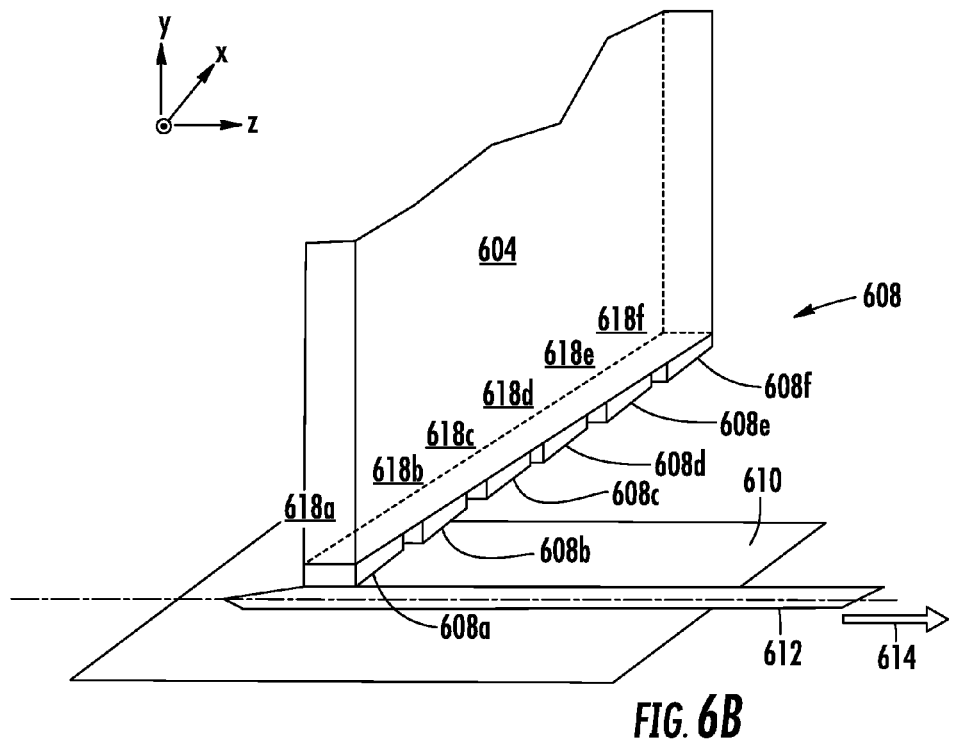

FIG. 6a depicts another embodiment of a widener 604 that can be used in conjunction with the initializer 602. In one embodiment, the initializer 602 is lowered toward the melt 610 along axis 606a and initiates crystallization, forming a narrow ribbon 612, which is drawn along the direction 614. After the narrow ribbon 612 is formed by the initializer 602, the widener 604 can be lowered along axis 606b toward the surface of the melt 610 so that radiative cooling takes place to crystallize regions of the melt 610 that lie outside of the narrow ribbon 612, such as regions 616 and 617. As illustrated, the widener 604 includes a set of zoned heaters 608 that are located on the lower portion of the widener 604 on a lower face that faces the melt 610. As further depicted in FIG. 6b, the zoned heaters 608 may comprise a set of heaters 608a-608f, which can be independently controlled to provide heating local to each heater. In this manner, when a cooling fluid is applied to widener 604, the temperature of the widener 604 can be increased locally in the regions 618a-618f by turning on a respective heater 608a-f. This has the effect of removing or reducing the radiative cooling in that portion of the widener 604. Accordingly, in order to widen a ribbon, the widener 604 may be placed over the ribbon 612 and lowered into proximity of the surface of the melt 610 with heaters 608a-f turned on. Subsequently, in order to initiate crystallization in a wider zone, inner heaters 608c, 608d can be turned off or turned down so that regions 618c and 618d of widener 604 become colder. At a still later instance, intermediate position heaters 608b, 608e can be turned off or turned down, lowering the temperature of regions 618b and 618e. Finally, outer position heaters 608a, 608f can be turned off or turned down, lowering the temperature of regions 618a and 618f. This progression of turning off heaters has the effect of gradually widening a cold zone above melt 610, which causes narrow ribbon 612 to gradually and monotonically widen as it is pulled underneath the widener 604.

In some embodiments, when the widener 604 is lowered, a portion of the lower surface of the widener 604 may define a cold area whose width is the same as the width of the cold area defined by initializer 602. This may be accomplished by having one or more of the heaters turned down or turned off so as to allow that portion of the widener 604 to present a cold area to the melt 610. In other embodiments, heaters may be absent from a portion of the lower surface of the widener 604. The heaters that are present on the lower surface of the widener 604 may provide heating outside of the area where no heaters are present so as to define a cold area where heaters are absent whose width may be the same as that provided by the initializer 602. Subsequently, the heaters may be turned off or turned down as described above to widen the cold area.

Turning once more to FIG. 5a, consistent with various embodiments the sustainer 506 has a uniform shape on its lower surface which can be parallel to the surface of melt 512 to provide a uniform temperature across the width of sustainer along the direction 518. In various embodiments, the sustainer 506 may be employed to maintain a wide uniform ribbon after the ribbon has been widened using the widener 504. When the sustainer 506 is lowered toward the melt 512 the widener 504 and initializer 502 may be retracted away from the melt 512. Subsequently, the sustainer 506 can provide uniform cooling over a fixed width, which results in growing a wide ribbon of uniform thickness and width.

As noted, in some embodiments, rather than providing a separate sustainer, a widener may also provide the function of a sustainer. For example, the widener 604 may be used to widen a crystalline ribbon by successively turning off heaters starting with inner heaters and ending with outermost heaters. Once all heaters are turned off, if the heat removal is uniform in direction 518, the widener may act as a uniform sustainer.

Figure 7A:
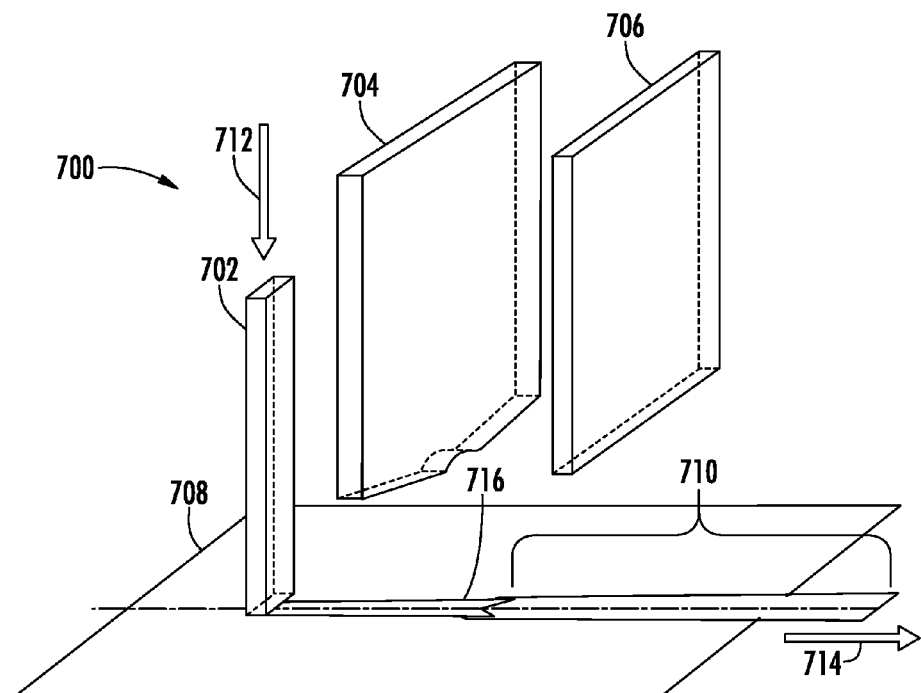
FIGS. 7a-7d depict a process sequence for horizontal ribbon growth consistent with the present embodiments.

FIGS. 7a-7d depict a process sequence for horizontal ribbon growth consistent with the present embodiments. In FIG. 7a, a crystalline seed 710 is place in the surface of a melt 708 and drawn in the direction 714. An initializer 702 of an HRG apparatus 700 is brought into proximity of the surface of the melt 708 by lowering the initializer 702 along the axis 712. A widener 704 and sustainer 706 are arranged in a retracted position so that they are not in proximity to the melt 708 and therefore exert no cooling effect on the melt 708. The initializer 702 causes anisotropic growth to initiate on one edge of the crystalline seed 710, forming a narrow ribbon 716 that increases in length as the crystalline seed 710 is drawn in the direction 714.

Figure 7B:
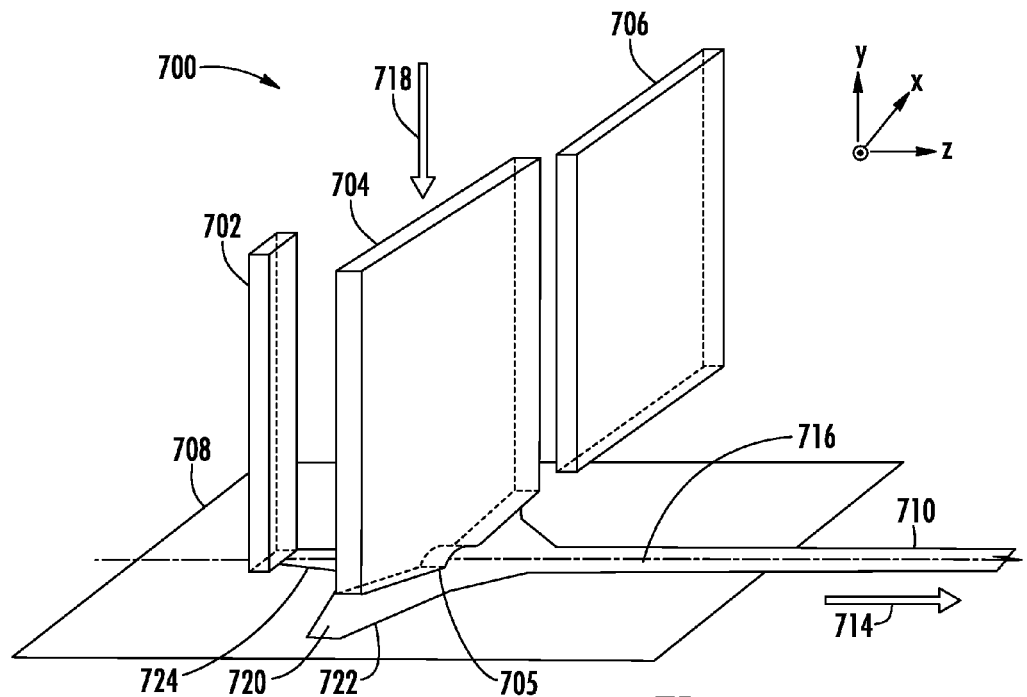

At FIG. 7b, the widener 704 is lowered along axis 718 until it comes into proximity of the melt 708 so that the widener 704 exerts a cooling effect on the melt 708. The initializer 702 remains proximate to the melt 708 and continues to exert a cooling effect. As illustrated, the narrow ribbon 716 expands into a wide ribbon portion 720. The wide ribbon portion 720 includes a trailing edge 722 that is tapered and forms as the widener 704, which exhibits a curved lower surface 705, is gradually lowered towards the melt. The gradual lowering of the widener 704 gradually expands the width of a cold area experienced by the melt 708, thereby gradually expanding the width of a crystallized area that results from the cooling, as discussed above. Between the initializer 702 and widener 704, the leading portion 724 of the ribbon is narrower, consistent with the width of the initializer 702.

Figure 7C:
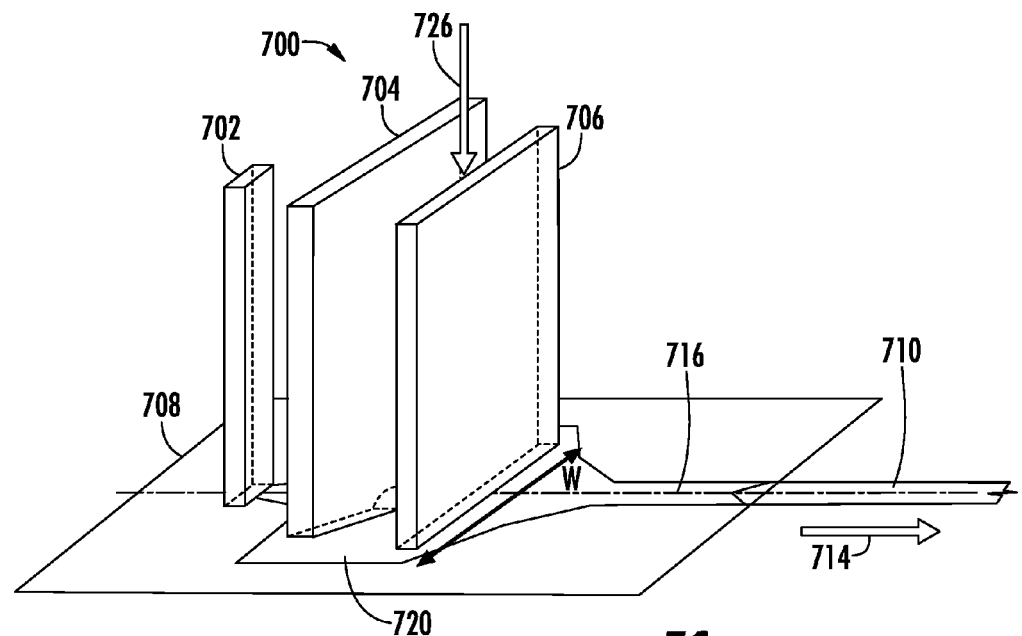
Figure 7D:
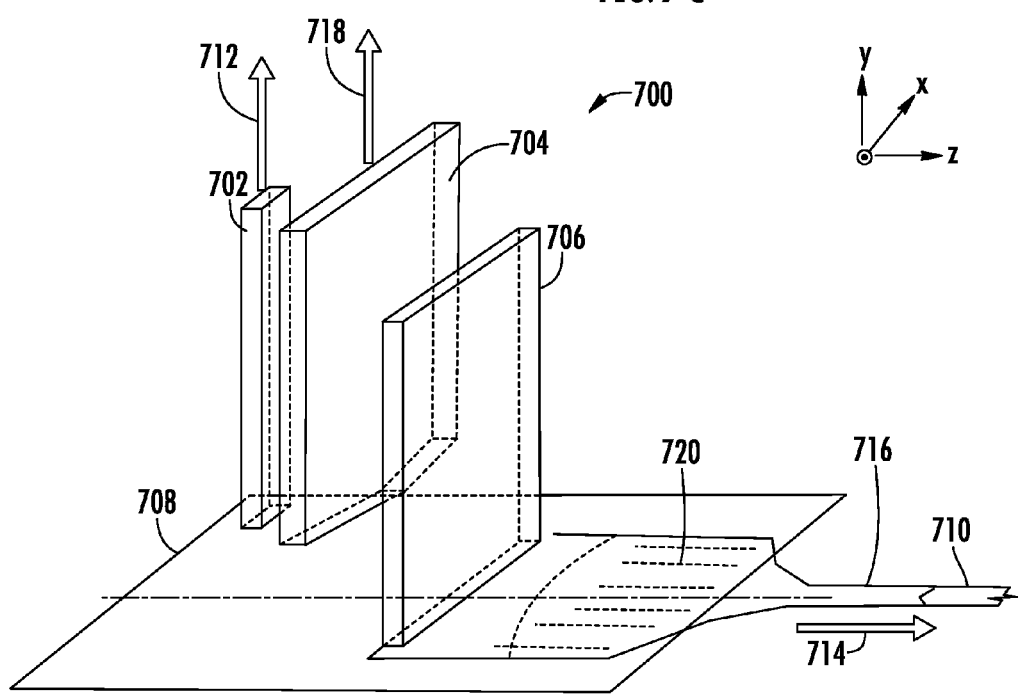

At FIG. 7c, the sustainer 706 is lowered along axis 726 so that the sustainer 706 exerts a uniform cooling effect across the width W. At FIG. 7d, the initializer 702 and widener 704 are withdrawn from near the melt 708 surface, while the narrow ribbon 716 continues to be drawn in the direction 714. This results in the wide ribbon portion 720 expanding in length with a uniform thickness.

In a variant of the process sequence depicted in FIGS. 7a-7d, the widener 604, whose operation is detailed above, may be provided in lieu of widener 704.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. An apparatus for growing a crystalline sheet from a melt, comprising:
   a first cold block assembly comprising:
   a first cold block;
   a holder coupled to the first cold block and operable to control a distance between the first cold block and a melt surface during operation;
   an insulator surrounding a portion of the first cold block;
   a first shield surrounding a portion of the insulator and the first cold block and being at an elevated temperature with respect to that of the first cold block, the first shield partially disposed on a first surface of the first cold block assembly proximate the melt surface and defining an opening disposed along the first surface such that a portion of the first cold block is exposed to the melt surface to define a first cold area having a first width in a first direction, the first cold area operable to provide localized cooling of a first region of the melt surface proximate the first cold block;
   a crystal puller arranged to draw a crystalline seed in a second direction perpendicular to the first direction; and
   a second cold block assembly comprising:
   a second cold block spaced apart from the first cold block in the second direction;
   a second holder coupled to the second cold block and operable to control a distance between the second cold block and the melt surface during operation; and
   a second shield surrounding the second cold block and being at a second elevated temperature with respect to the second cold block, the second shield defining a second opening disposed along a second surface of the second cold block proximate a second region of the melt surface and defining a second cold area having a width that increases in the first direction from the first width to a second width, wherein a vertical distance between the melt surface and the second surface varies in the first direction to position outer regions of the second surface along the first direction at a greater vertical distance from the melt surface than inner regions of the second surface.

2. The apparatus of claim 1, the first shield comprising a set of compensation heating elements arranged to provide, in regions surrounding the first cold block outside of the first cold area, a surface temperature of the first cold block assembly within ten degrees Celsius of a temperature of the melt surface.

3. The apparatus of claim 2, the compensation heating elements operable to provide the surface temperature of the first cold block assembly of about 1412° C.

4. The apparatus of claim 1, the first cold block defining a passage inside the first cold block that is connected to a cooling fluid source.

5. The apparatus of claim 1, further comprising:
   at least one light pipe disposed in the first cold block proximate the first cold area, the light pipe configured to conduct light to a pyrometer that generates a signal; and
   a controller operable to receive the signal from the pyrometer and generate control signals to initiate a pulling of the crystalline seed along the melt surface when a radiation level proximate the melt reaches a predetermined threshold.

6. The apparatus of claim 1, the second surface defining a recess in an innermost region of the second surface, the recess having a width about equal to the first width.

7. The apparatus of claim 1, the second cold block assembly comprising two or more heating elements disposed along the second surface, the second cold block assembly operable to decrease power to at least one of the two or more heating elements so as to decrease the width of the second cold area from the second width to a third width in the first direction.

8. The apparatus of claim 7, further comprising:
a third cold block assembly, the third cold block assembly comprising:
a third cold block; and
a third shield surrounding the third cold block, the third shield being at a third elevated temperature with respect to the third cold block, the third shield comprising a third opening disposed along a third surface of the third cold block proximate a third region of the melt surface and defining a third cold area, the third cold area having a fourth width about equal to the third width, and the third surface comprising a flat shape so as to provide uniform heat flux removal.

* * * * *